United States Patent [19]

Lambert

[11] Patent Number: 5,055,902
[45] Date of Patent: Oct. 8, 1991

[54] $V_P$-CORRECTED OFFSET VOLTAGE TRIM

[76] Inventor: Craig N. Lambert, 1658 Magnolia Blossom Ln., San Jose, Calif. 95124

[21] Appl. No.: 627,469

[22] Filed: Dec. 14, 1990

[51] Int. Cl.[5] ............. H01L 27/02; H01L 29/80; H01L 29/90
[52] U.S. Cl. .................................. 357/41; 357/22; 357/13
[58] Field of Search .................. 357/41, 22, 13

[56] References Cited

U.S. PATENT DOCUMENTS 4,176,368 11/1979 Compton ............................ 357/41
4,496,963 1/1985 Dunkley et al. .................. 357/52
4,618,833 10/1986 Russell ............................. 330/255

Primary Examiner—Mark Prenty
Attorney, Agent, or Firm—Gail W. Woodward; Michael A. Glenn; James W. Rose

[57] ABSTRACT

A trim arrangement for adjusting a differential input stage in a BIFET® integrated circuit is presented wherein the trimming is done at wafer probing in the manufacturing process. Trim JFETs are invoked by means of reverse biased zener diodes which can be zapped thereby to achieve trimming in the conventional manner. The trim JFETs are ratioed in size so that the trim is $V_P$ compensated over a relatively broad range. An improved trim structure is presented wherein the offset trim is $V_P$ compensated and operated in a manner that renders its effect on the circuit constant and independent of the conventional load trim.

7 Claims, 4 Drawing Sheets

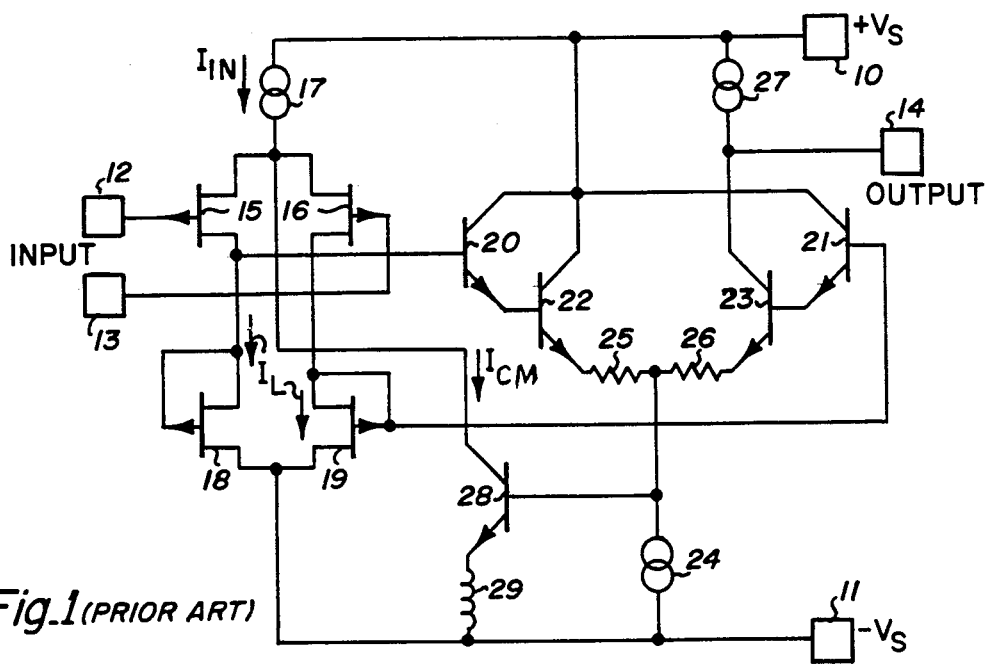
Fig_1 (PRIOR ART)
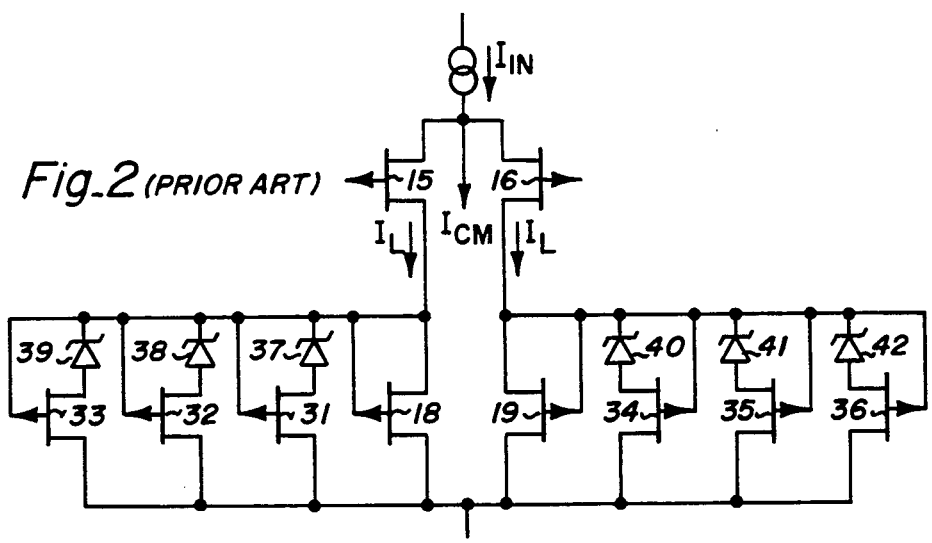
Fig_2 (PRIOR ART)
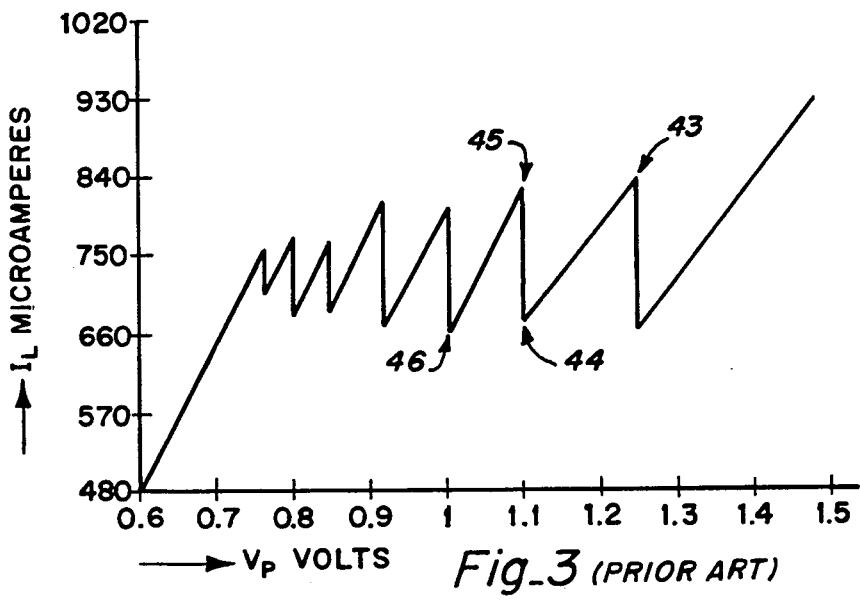
Fig_3 (PRIOR ART)

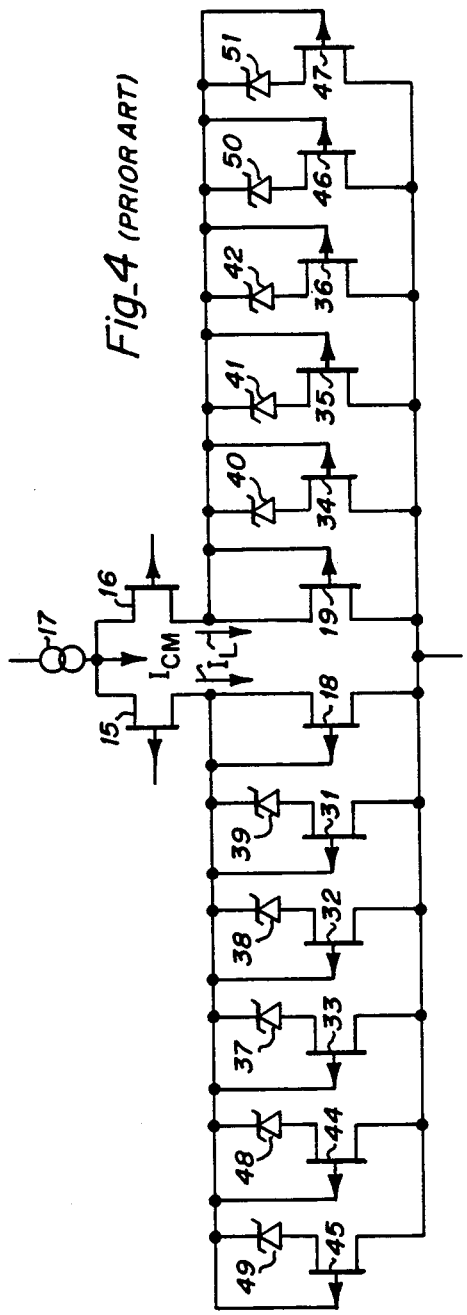
Fig_4 (PRIOR ART)
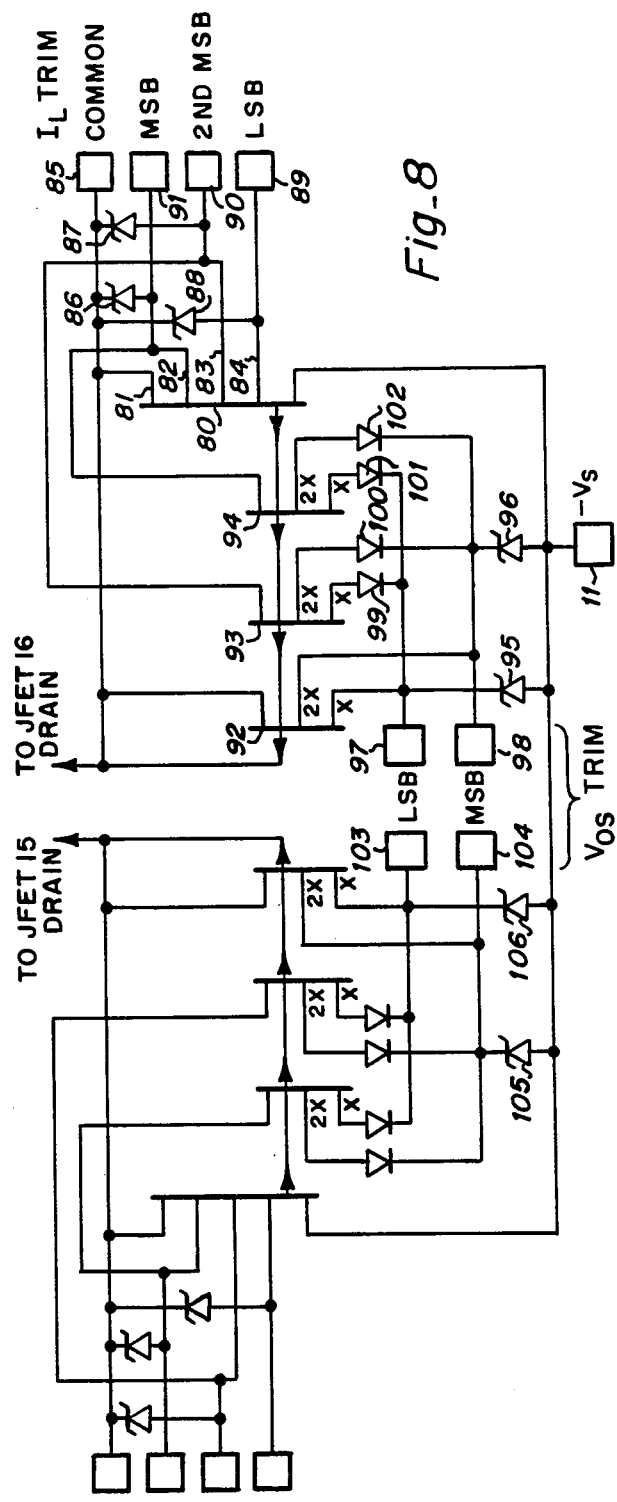
Fig_8

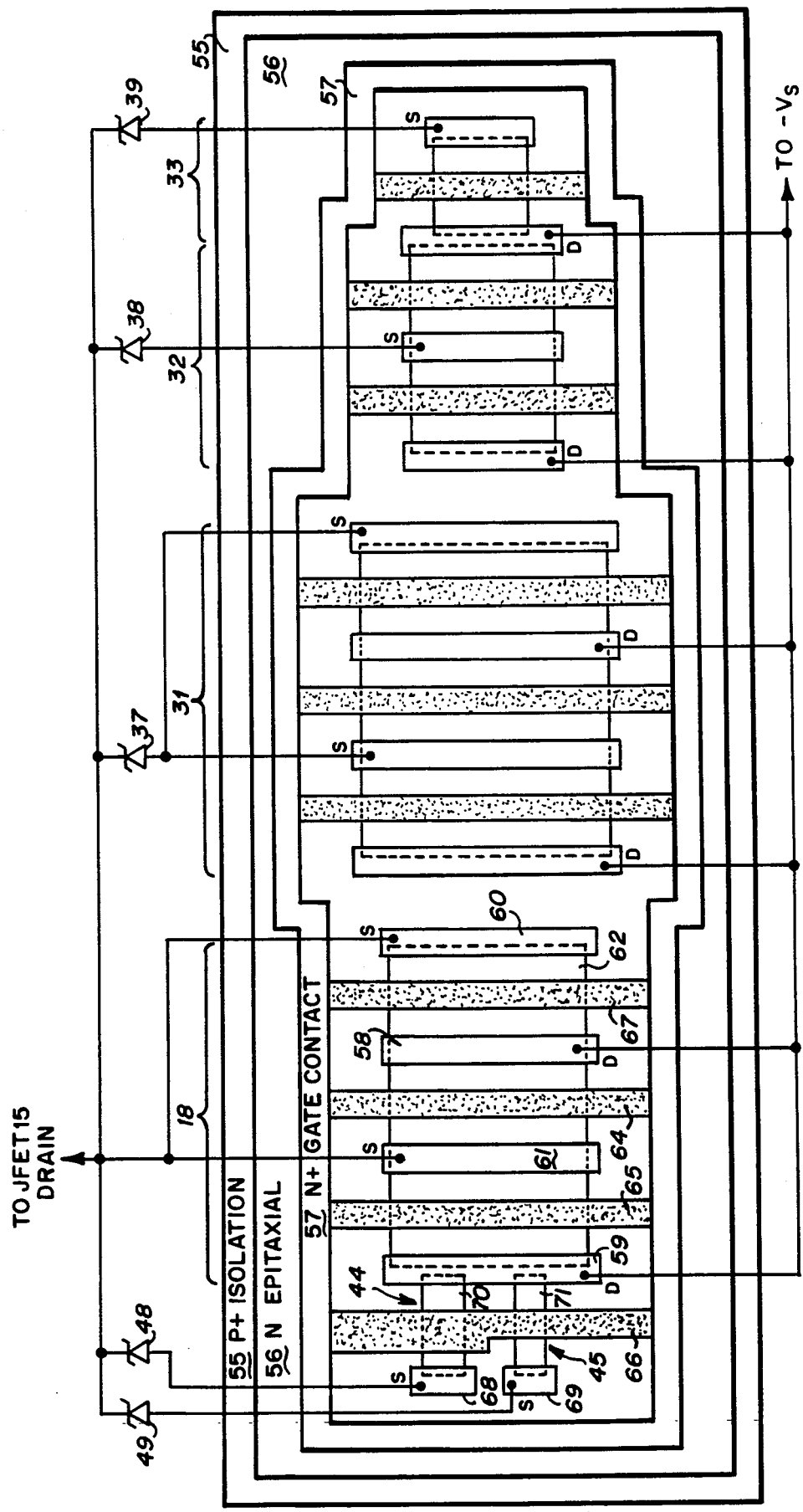
Fig._5 (PRIOR ART)

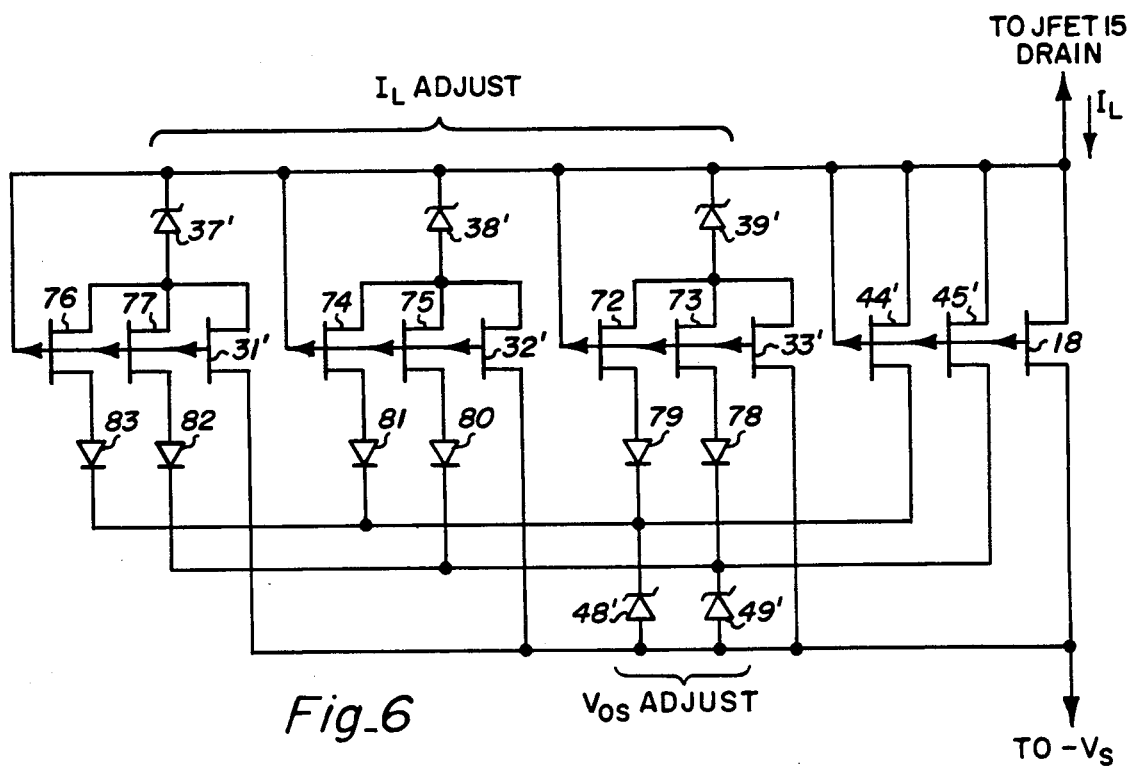
Fig_6
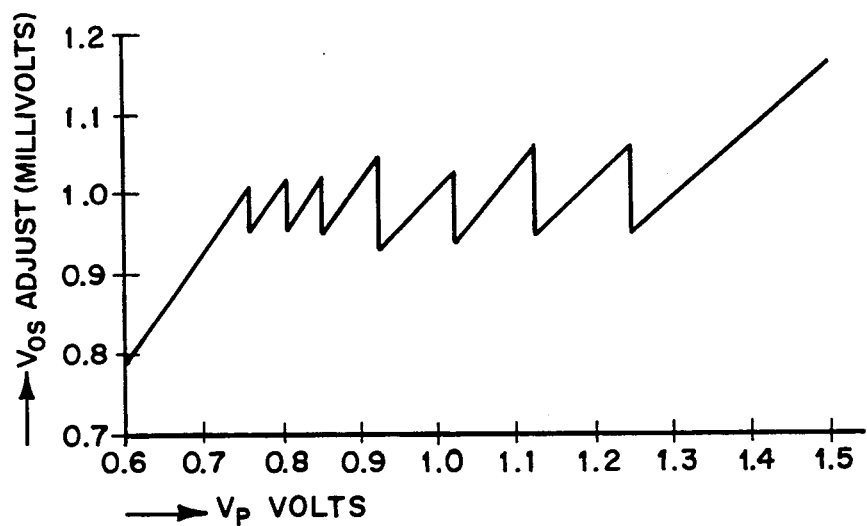
Fig_7

$V_P$-CORRECTED OFFSET VOLTAGE TRIM

BACKGROUND OF THE INVENTION

The invention relates to BIFET ®integrated circuit (IC) devices. This class of IC employs conventional bipolar junction transistors (BJT's) in combination with junction field effect transistors (JFET) devices to produce high performance circuits. In an operational amplifier (op-amp) circuit the offset voltage ($V_{OS}$) is defined as the differential input voltage required to produce a reference output voltage (usually ground potential in a dual voltage power supply). Typically, the IC device is trimmed to bring the $V_{OS}$ into specification. U.S. Pat. No. 4,618,833 discloses an offset trim, using zener zapping, that can be employed at either wafer probing, in the IC manufacturing process, or, following device assembly, to reduce $V_{OS}$ to a desired value without changing the $V_{OS}$ temperature drift.

The basic JFET structure employed in BIFET IC devices is disclosed in U.S. Pat. No. 4,496,963 and an improved version is disclosed in U.S. Pat. No. 4,176,368. The teachings in the above three patents are incorporated herein by reference.

In a patent application, Ser. No. 571,378, filed Aug. 21, 1990, and titled USER-PROOF POST-ASSEMBLY OFFSET VOLTAGE TRIM, means for providing a post assembly offset trim is disclosed. After trimming, the trim circuit can be deactivated so that no further offset change can be produced. This avoids inadvertent user access to the trim circuit and, thus, "user-proofs" the IC. The teaching in this patent application is also incorporated herein by reference.

The JFET devices employed in op-amp circuits are constructed in a process that also creates the well-known bipolar junction transistor (BJT) elements along with other IC component elements. The JFETs provide device parameters that are well-known. For example, the gate pinch-off voltage $V_P$ is defined as the gate to source voltage that will produce a specified drain cutoff current at a specified source to drain voltage. The saturation current ($I_{DSS}$) is defined as the source to drain current that flows at a specified source to drain voltage and zero gate to source voltage. These parameters vary significantly in the manufacturing process and it is desirable to provide trimming to bring the op-amp characteristics into specification as part of the manufacturing process. Typically, the IC is energized and its performance measured. If the characteristics are within the specification, nothing is done. If the specifications are not met, trimming is performed to alter the characteristics so as to bring them within the specification. If the trim range is insufficient to provide the desired characteristics the IC is regarded as a reject.

SUMMARY OF THE INVENTION

It is an object of the invention to provide an offset trim for a differential JFET input stage wherein the offset trim is compensated for JFET pinch-off voltage processing variations.

It is a further object of the invention to provide a plural JFET trim for a JFET differential input stage wherein the plural JFET's are digitally related and to further provide a JFET offset trim which is compensated for JFET pinch-off variations due to processing.

These and other objects are achieved by employing a JFET input stage in which the load elements are JFET's operated to conduct $I_{DSS}$ currents. A series of digitally related trimming JFET's are included using reverse-biased zener diodes to isolate them. One or more of the trimming JFET's can be connected by selectively zapping the series-connected zener diodes. The input stage load is trimmed by biasing the load element and then zapping the zener diodes to bring the load conduction into specification. Since the $I_{DSS}$ of a JFET is a strong function of JFET $V_P$, this process can be $V_P$ compensated by providing properly related JFET sizes in performing the load trim. In adjusting $I_L$ both halves of the input stage are treated the same. Additional small area JFET's are included in the trimming whereby the two halves can be trimmed differently to reduce the offset voltage. First, the offset is measured and trim JFET's selected to compensate the offset. Then, the appropriate zener diode(s) zapped to achieve the compensation. It is clear that the $I_L$ trim will result in effective JFET area value variations that are a function of the variations in $V_P$. Thus, the magnitude of the effect of an added trim JFET will be a function of the previously operated $I_L$ trim. The invention relates to means for compensating the offset trim so that the trim operation will have an effect that is constant regardless of the results of the $I_L$ trim previously employed.

This is done by means of trim JFET devices that are varied in area in accordance with the JFET devices selected in the $I_L$ trim. If a large area JFET is invoked in the $I_L$ trim a similarly ratioed JFET is added to the offset trim JFET so that its addition, by way of the zener zap, is proportionately larger. By incorporating a plurality of JFET's into the offset trim JFET's and invoking them, in accordance with the $I_{DSS}$ trim, a $V_P$ compensated offset trim is produced. The target trim is selected so that a target specification value of offset is achieved over the encountered range of $V_P$ variation.

BRIEF DESCRIPTION OF THE DRAWING

FIG. 1 is a simplified schematic diagram of the first two stages in the prior art BIFET integrated op-amp circuit.

FIG. 2 is a simplified schematic diagram of a prior art $I_L$ trim circuit.

FIG. 3 is a graph showing the performance of the FIG. 2 circuit when the JFET's are selected to produce $V_P$ compensated $I_L$ trimming.

FIG. 4 is a simplified schematic diagram of a combined prior art $I_L$ and $V_{OS}$ trim.

FIG. 5 is a view of the topography of an IC chip fragment showing the configuration of a trim section that would be employed twice in creating the circuit of FIG. 4.

FIG. 6 is a simplified schematic diagram of the circuit of the invention.

FIG. 7 is a graph showing the performance of the circuit of FIG. 6 wherein $V_P$ compensated $V_{OS}$ adjust trimming is achieved.

FIG. 8 is a schematic diagram of an alternative embodiment of the invention.

DESCRIPTION OF THE PRIOR ART

FIG. 1 is a simplified schematic diagram of a prior art BIFET op-amp input section employing JFET input devices. The first (or input) and the second amplifier stages are shown. The circuit is operated from a $V_S$ power supply connected positive to terminal 10 and negative to terminal 11. This can be a single power supply or it can be a dual supply with the common juncture representing a bias reference point such as a ground (not shown). Input terminals 12 and 13 accept a differential signal input and output terminal 14 provides a single-ended signal output.

P channel JFET's 15 and 16 have their gates connected respectively to input terminals 12 and 13. Their sources are commonly supplied with current from constant current source 17 so that the input stage is operated differentially. Transistors 18 and 19 have their gates returned to their sources to provide zero gate-to-source bias and they respectively act as load elements for transistors 15 and 16. In operation $I_{DSS}$ flows in each of transistors 18 and 19. The current flowing in each of transistors 18 and 19 is designated $I_L$ and the current in source 17 is designated $I_{IN}$.

The drains of transistors 15 and 16 are coupled to drive the high gain differential input second stage which also provides a single-ended output. Emitter follower transistors 20 and 21 buffer the second stage input and respectively drive the bases of transistors 22 and 23. Constant current sink 24 causes transistors 22 and 23 to operate differentially and resistors 25 and 26 degenerate the gain so as to stabilize the second stage. The collectors of transistors 20 through 22 are returned to the positive supply rail while current source 27 supplies a constant current to the collector of transistor 23 which develops the single-ended output at terminal 14. Source 27 operates at one-half of the current in sink 24.

Transistor 28 has its base connected to the constant current sink 24 so that it is driven by the common mode voltage of the second stage. The collector is connected to the sources of input JFET's 15 and 16. Thus, transistor 28 forms a high gain negative feedback loop around the first two circuit stages. This feedback loop stabilizes the d-c operating level of the input section shown. Resistor 29 degenerates the gain of transistor 28 and acts to stabilize the operation of the common mode feedback loop. In operation, the action of transistor 28 will set the potential at the sources of transistors 15 and 16 such that the common mode potentials across load transistors 18 and 19 are held constant. Typically, the maximum potential across transistors 18 and 19 is about two volts. The current in transistor 28 is referred to as the common mode current, $I_{CM}$, and its value is equal to $I_{IN}-2I_L$.

FIG. 2 is a schematic diagram that shows a well-known trim scheme for controlling the value of $I_L$ in the circuit of FIG. 1. Elements 15 through 19 are the same as those of FIG. 1. It can be seen that three additional JFET's have been added in parallel with each of transistors 18 and 19. Each of transistors 31 through 36 has a zener diode in series with its source. Since the zener diodes 37 through 42 are reverse biased below their zener voltage they all represent open circuits. Thus, with the diodes in their original form, JFET's 31 through 36 are inoperative. In the IC chip circuit form each of zener diodes 37 through 42 is connected to a probe pad and they are thus available at the wafer probing stage of IC fabrication. Of course, the common terminals which represent the drains of transistors 15 and 16 are also connected to probe pads. In wafer fabrication the wafer probe operation can be employed to render the circuit operational and determine its performance. One such operation involves the measurement of $I_L$ and the trimming of its value to a desired level.

In the original circuit design transistor 18 is deliberately made too small and the sizes of transistors 31-33 are digitally related so that some combination thereof will bring the $I_L$ value to within specification. When the circuit is biased to operate during wafer probing the measurement of $I_L$ is undertaken by biasing transistors 15 and 16 off and applying a constant voltage across the load transistor 18 or 19 whichever is being measured. Since these transistors are initially too small the resultant current will ordinarily be too low. Its measured value will determine whatever increase must be invoked. Then, zener diodes 37-39 are zapped in that combination which will add transistors 31-33 in parallel with transistor 18 to produce the desired value of $I_L$. Whatever trimming is obtained, by way of zener diodes 37-39, the same diode combination on the other side of the circuit is also zapped so that both sides have $I_L$ values that are in specification. The value of $I_L$ is typically required to be within ±90 microamperes of the target value of 750 microamperes.

By judiciously controlling the sizes of transistors 31-36 the $I_L$ trim can be $V_P$ corrected. In the operation of a JFET it is well-known that manufacturing tolerances result in relatively large $V_P$ variations. It has been found that $V_P$ will typically vary over the range of about 0.6 to 1.4 volts. Such variations produce substantial variations in $I_{DSS}$ which varies approximately as the square of $V_P$. It has been learned that if transistor 18 is made to have a channel width to length rate of 61.5 and transistors 31, 32 and 33 have ratios of 77.25, 34.5 and 15.5 respectively, the curve of FIG. 3 results. This curve is a plot of $I_L$ versus $V_P$ for the circuit of FIG. 2. The curve portion at the far right is actually the current of transistor 18 alone. It will be noted that the target $V_P$ value is achieved over the range of about 1.4 to 1.25 volts. If zener diode 37 is zapped to connect transistor 31 in parallel with transistor 18, the curve between points 43 and 44 will result. This combination will result in acceptable $I_L$ over the $V_P$ range of about 1.25 to 1.1 volts. The curve between points 45 and 46 result when zener 38 alone is zapped. This provides an acceptable $I_L$ over the $V_P$ range of about 1 to 1.1 volts. The extreme left-hand portion of the curve is dedicated to low $V_P$ values and represents the condition where all three zeners (37-39) have been zapped. It will be noted that the value of $I_L$ falls within specification over the $V_P$ range of 0.7 to 1.4 volts. Since there are three zener diodes (and three JFET's) the curve has seven inflection peaks and eight curve slopes. If a closer tolerance on $I_L$ is to be achieved additional properly sized JFET's and associated zeners could be added to the circuit of FIG. 2. However, the numbers described above have resulted in an acceptable compromise of performance/cost ratio. It will be noted that any devices which, after trimming, fall outside of the specifications, are regarded as rejects.

All of the above, which relates to FIGS. 1 and 2, represent mirror symmetry activity for which the left and right hand groups of elements are treated equally. As an additional trim feature it would be desirable to treat the two halves differently so that input offset could be balanced out. While the elements of FIG. 1 are symmetrical and the IC layout is created so that the differential parts balance, there is typically a problem with achieving an exact balance. Typically, the IC is guaranteed to operate within an offset specification. However, to increase the yield of in-specification devices, it has been deemed useful to trim the offset at wafer probing in production. Accordingly, the scheme shown in FIG. 4 has been used. Here four JFET's (44–47) and four zener diodes (48–51) have been added to the circuit of FIG. 2. Typically, JFET's 46 and 47 are ratioed in size and JFET's 44 and 45 ratioed the same way. These added JFET's are substantially smaller than any of the other trim JFET's.

In the offset trim at wafer probing the circuit is activated and the offset measured. Then, one of the two sides of the circuit is selected and trimmed to reduce the offset. Which side is to be trimmed is determined by the offset polarity and the magnitude of the offset determines how many trim JFET's are to be added. Since there are two JFET's on each side, there are three related trim values. If the offset measurement is within specification none of the zener diodes (48–51) will be zapped. Otherwise, depending on the trim required, zeners 48 or 49, or 48 and 49 will be zapped. Alternatively, if the opposite offset polarity trim is required, zeners 50 or 51, or 50 and 51 will be zapped. Since the offset correction is relatively small the $I_L$ values will not be significantly changed.

FIG. 5 shows a chip fragment typography for an IC implementation of the circuit of FIG. 4. The drawing is not to scale, but is designed only to illustrate the general principles of construction. Only one-half (the transistor 18 portion) is shown because an identical structure will be created for the other side (the transistor 19 portion). Ring 55 represents an isolation diffusion which is created in the conventional way in an N type epitaxial layer located on a P type substrate wafer. This is the well-known PN junction isolation employed in silicon monolithic epitaxial IC construction. Thus, the material 56 inside ring 55 is a tub of N type epitaxial silicon. In FIG. 5 the oxide, metalization and passivation layers are omitted for clarity. The metallization and associated zener diodes are shown schematically.

Ring 57 is an N+ type diffusion that makes a low resistance ohmic contact to epitaxial tub 56. Ring 57 will comprise the gate electrode terminal of the trimming JFET's. P type diffusions 58 and 59 form the drain electrodes of transistor 18, the source of which is P type diffusions 60 and 61. A P type channel region is located at 62 where it overlaps regions 59 and 61. Since channel 62 is the same conductivity type and is more lightly doped than source and drain regions 58 through 61, it will be ohmically connected thereto. While not illustrated in FIG. 5, the entire N type tub 56 is overlaid by a very thin N type layer in the form of a cap which is characteristic of BIFET IC devices. This cap ensures that the transistor channel action is confined to the silicon below the wafer surface. This action is fully set forth in U.S. Pat. Nos. 4,176,368 and 4,496,963. Since regions 58 and 59 are connected together as are regions 60 and 61, transistor 18 is actually three JFET devices in parallel. Regions 64, 65 and 67 are N-type diffusions that extend part way through the P type channel regions thereby providing the top gate electrode function. Diffusions 64, 65 and 67, which are shown stippled, extend to overlap ring 57 and are, therefore, ohmically connected thereto. It will be noted that these three diffusions substantially determine the transistor channel length dimension while the channel width is set by the channel diffusion 62. Those gate portions of transistor 18 that lie outside the width of diffusions 64, 65 and 67 are active, but contribute little to the effective length of the JFET's.

Transistor 31 is constructed in a manner similar to that of transistor 18. However, it is wider thereby providing an increased width/length ratio. Transistor 32 is made up of two transistors in parallel and it can be seen that its channel width is substantially less than either transistor 18 or transistor 31. One of the drain elements of transistor 32 serves as the common drain of transistor 33. Here a single JFET is present having a width that is appreciably smaller than that of transistor 32. Thus, transistor 33 has the smallest size of any of the $I_L$ trim devices.

Offset trim transistors 44 and 45 represent devices that are even smaller than transistor 33 and they both share a common drain 59 with transistor 18. Source diffusion 68 and channel diffusion 70 form transistors 44 while source diffusion 69 and channel diffusion 71 form transistor 45. It will be noted that transistor 45 has the smallest channel width of any of the transistors and the top gate diffusion 66 is shaped such that it has the longest channel length. Actually, transistor 44 is typically made to have about double the width/length ratio present in transistor 45. This two-to-one area ratio gives the offset trim a digital range of three-to-one whereby the trim provides integers of 1, 2 and 3 for the offset trim.

The trim scheme presented in FIGS. 4 and 5 has one serious drawback. Referring back to FIG. 3 it will be noted that for high values of $V_P$ only transistor 18 will be present in the final structure. For this condition transistors 44 and 45 will have an excessive trim range. However, when $V_P$ is low all of transistors 18, 31, 32 and 33 will be in parallel to provide the target value of $I_L$. For this condition, transistors 44 and 45 will represent a greatly reduced area ratio and the trim range will be substantially reduced. This condition severely complicates the off-set trim.

DESCRIPTION OF THE INVENTION

FIG. 6 is a schematic diagram of a trim circuit that avoids the above-described problem that is associated with the FIG. 4 circuit. Where the parts are similar in function to those of FIG. 4, the same numerals are used. It will be noted that all of the JFET gates are connected to the source of transistor 18. Since the two halves of the circuit operate the same way, only the lefthand portion will be shown and described in detail.

Transistor 18 has its gate directly connected to its source and its drain connected to the negative supply rail. Thus, its $I_{DSS}$ conduction provides one portion of $I_L$. Transistors 44' and 45' are small area devices sized to provide a suitable off-set trim ratio for transistor 18 alone. These two transistors have a two-to-one relative size ratio thereby providing the digital three, two or one combinations, depending upon whether zener diodes 48' or 49', or both, are zapped. Transistors 72 and 73 represent small area devices that add offset trim currents to transistor 33'. They are ratioed two-to-one with respect to each other and add off-set trim currents to that of transistor 33' in the proper ratio. In other words, when transistor 33' is connected to trim $I_L$, by zapping diode 39', an offset trim term is also added in the desired proportion.

Similarly, small area transistors 74 and 75 are coupled to transistor 32'. Thus, when 32' is invoked in $I_L$ trim, by zapping diode 38', offset trim elements are added as required in the proper ratio. Transistors 76 and 77 operate in a similar manner with $I_L$ trim transistor 31'.

The above-described offset trim compensation adds transistors whose currents are proportionally controlled, but the extra transistors can introduce unwanted reverse current flow. It is noted that a JFET will conduct a current equally well in either direction. Thus, a source can function as a drain and vice versa depending upon the applied potentials. Diodes 78-83 are present to block reverse JFET conduction in transistors 72-77. These diodes are simply minimum area PN junction diodes.

FIG. 7 is a graph plotting the performance of the circuit of FIG. 6. The coordinates are the change in, or adjustment increment of, offset voltage vertically and $V_P$ horizontally. The target $V_{OS}$ adjustment is 1 mV ± 0.1 mV. In the $V_P$ manufacturing spread of 1.4 to 0.7 volts it can be seen that $V_{OS}$ adjustment is clearly $V_P$ compensated. Since three $I_L$ trim JFET's, 31', 32' and 33' are involved, the plot involves eight slopes and seven inflections.

FIG. 8 is a simplified schematic diagram of an alternative embodiment of the invention. While the FIG. 6 embodiment employs a total of ten zener diodes, twenty-four load element JFET's and twelve junction diodes, the circuit of FIG. 8 requires ten zener diodes, but only eight junction diodes and eight plural electrode load element JFET's. Two of the load element JFET's have four separate sources and a common drain. The other six each have dual drains and a common source. These dual drains are digitally related two to one as shown. Six additional probe pads are required on each half of the circuit for trimming.

In FIG. 8 it will be noted that the schematic diagram has mirror symmetry. The right hand half will be described in detail with the understanding that the left hand half works the same way. Transistor 80 includes four individual sources (81 through 84). The gate of transistor 80 is returned to its source 81 and to common trim pad 85. These sources are digitally related. Source 81 provides a device W/L ratio of 61.5, source 82 provides a ratio of 77.25, source 83 provides a ratio of 34.5 and source 84 provides a ratio of 15.5. Thus, these elements operate as was described for FIGS. 1 through 5. Zener diodes 86-88 can be zapped in a desired combination to invoke sources 82-84 respectively. This provides an $I_L$ trim wherein probe pads 85 and 89-91 provide access respectively for zapping zener diodes 86-88. Pad 89 will provide the LSB trim, pad 90 the second MSB trim and pad 91 the MSB trim.

Transistors 92-94 provide the $V_P$ compensated $V_{OS}$ trim described above. Each of these transistors includes a dual drain structure in which one drain has twice the area of the other. This means that each of transistors 92, 93 and 94 can be selected for a digital offset trim contribution of 1, 2 or 3. Transistor 92, which has its gate-source circuit in parallel with that of transistor 80, is sized to be a compatible offset trim with source 81 of transistor 80. One or both of its drains can be invoked by zapping one or both of zener diodes 95 and 96. These diodes are accessed by probe pads 97 and 98 respectively with reference to pad 11. Transistor 93 is sized to provide the desired offset trim ratio for source 83 in transistor 80. This ratio is made the same as the ratios in source 81 and transistor 92. Likewise, transistor 94 is sized to provide the same ratio between it and source 82. It will be noted that no $V_{OS}$ compensation is employed for source 84. This can be accepted because the $I_L$ contribution of source 84 is relatively small with respect to the other sources in transistor 80.

As was the case in FIG. 6, PN junction diodes 99-102 are present to avoid reverse conduction in JFET's 93 and 94.

In operation the two halves of FIG. 8 are trimmed identically to target $I_L$ using pads 85 and 89-91. Then, the offset is measured and the side that must be trimmed determined by the sign of the offset. Then, either pads 97 or 98, or both, are employed to zap zeners 95 or 96, or both. Alternatively, the left hand side of the circuit can be invoked to oppositely trim $V_{OS}$ by zapping zener diodes 105 or 106, or both, by way of probe pads 11, 103 and 104. Thus, the upper probe pads 97 and 103 represent the LSB offset trim and lower pads 98 and 104 represent the MSB offset trim.

The circuit of FIG. 8 can be fabricated into an IC using minimum chip area and involves the addition of only ten probe pads (pads 11 and 85 are already required). It provides an acceptable trim range and will also produce a $V_{OS}$ trim that is $V_P$ compensated. These are achieved while using substantially fewer probe pads and yet providing the full trim resolution.

The invention has been described and a preferred embodiment detailed. An alternative embodiment has also been described. When a person skilled in the art reads the foregoing description, alternatives and equivalents, within the spirit and intent of the invention, will be apparent. Accordingly, it is intended that the scope of the invention be limited only by the claims that follow.

I claim:

1. In a trimmable junction field effect transistor differential input stage wherein a pair of transistor load elements are each provided with a first plurality of parallel connected digitally ratioed trim elements, in the form of transistors, each one of which is isolated by a zener diode that can be zapped or shorted, thereby to invoke the associated trim element and wherein sufficient ones of the zener diodes are zapped to invoke a sufficient number of trim elements to bring the load element conductivity into specifications and further wherein a second plurality of parallel connected digitally ratioed trim elements in the form of small-area transistors which are zener-diode isolated, thus, rendering said second plurality of trim elements connectable to said load elements so that said pair of load elements can be trimmed differently thereby to balance or equalize said differential input stage, the improvement comprising:

providing each transistor in said first plurality of trim elements with additional zener-diode-isolated, size-related, trim transistors which can be connected in parallel with the elements of said second plurality of trim elements by zener diode zapping whereby said second plurality of trim elements can be compensated to have a normalized effect, independent of said load element conductivity, following the trimming of its conductivity.

2. The improvement of claim 1 wherein said additional trim transistors have digital size relationship ratios that are the same as said digital relationship ratios in said first plurality of trim elements.

3. The improvement of claim 1 wherein said first and second pluralities of trim elements have individual elements that are commonly connected to common zener diodes whereby like digitally-ratioed transistors can be invoked simultaneously while trimming said first plurality of transistors to achieve a compensated offset trim following said load element conductivity trim.

4. The improvement of claim 3 wherein each transistor in said second plurality of trim elements includes a series-connected diode poled to prevent reverse current from flowing therein.

5. The improvement of claim 4 wherein said first plurality of trim elements is produced by means of a single plural source transistor wherein the plural sources are digitally related in size and includes a single common drain.

6. The improvement of claim 5 further including a plurality of dual drain trim transistors each one having a pair of digitally ratioed drains which can be invoked by offset trim zener diodes, said dual drain transistors being ratioed in size in the same ratio as said plural sources in said first plurality of trim elements.

7. The improvement of claim 6 wherein at least some of said dual drain trim transistors include series connected diodes poled to prevent reverse current flow in said dual drain trim transistors.

* * * * *